United States Patent
Baranwal et al.

(10) Patent No.: US 8,452,024 B2
(45) Date of Patent: May 28, 2013

(54) GROUND LOOP NOISE REJECTION FOR A HEADSET SUBSYSTEM

(75) Inventors: Shailendra K. Baranwal, Bangalore (IN); Amit Goyal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 512 days.

(21) Appl. No.: 12/839,037

(22) Filed: Jul. 19, 2010

(65) Prior Publication Data

US 2011/0268289 A1   Nov. 3, 2011

(30) Foreign Application Priority Data

Apr. 29, 2010 (IN) ............................ 1202/CHE/2010

(51) Int. Cl.
*H04R 1/10* (2006.01)

(52) U.S. Cl.
USPC ........................................... 381/74; 381/119

(58) Field of Classification Search
USPC ............. 381/74, 120, 123, 85, 107, 121, 104, 381/109, 1, 94.1, 94.6, 102, 119
See application file for complete search history.

(56) References Cited

U.S. PATENT DOCUMENTS

| | | | | |
|---|---|---|---|---|
| 6,314,330 B1* | 11/2001 | Matthews | ...................... | 700/94 |
| 6,373,954 B1* | 4/2002 | Malcolm, Jr. et al. | ........ | 381/119 |
| 6,405,093 B1* | 6/2002 | Malcolm, Jr. et al. | .......... | 700/94 |
| 6,628,999 B1* | 9/2003 | Klaas et al. | ..................... | 700/94 |
| 6,952,621 B1* | 10/2005 | Malcolm, Jr. et al. | .......... | 700/94 |
| 8,194,893 B1* | 6/2012 | Lewis | ........................... | 381/118 |
| 8,320,591 B1* | 11/2012 | Wurtz | .......................... | 381/309 |

\* cited by examiner

*Primary Examiner* — Vivian Chin
*Assistant Examiner* — Friedrich W Fahnert
(74) *Attorney, Agent, or Firm* — Alan A. R. Group; Wade J. Brady, III; Frederick J. Telecky, Jr.

(57) ABSTRACT

For headphone subsystems that employ common ground switches for speaker outputs (for example), there can be a significant issue with cross-talk and ground noise. Here, configurations for an amplifier and switch network are provided, which generally cancel noise from the "ground switch," so as to provide an improvement over conventional configurations with little overhead. Additionally, the cross-talk for these configurations are not generally dependent on the "ground switch" or speaker impedance.

20 Claims, 2 Drawing Sheets

GROUND LOOP NOISE REJECTION FOR A HEADSET SUBSYSTEM

CROSS-REFERENCE TO RELATED APPLICATIONS

This application claims priority from Indian Patent Application No. 1202/CHE/2010, filed Apr. 29, 2010, which is hereby incorporated by reference for all purposes

TECHNICAL FIELD

The invention relates generally to a headphone subsystem and, more particularly, to ground loop noise rejection circuitry for a headset subsystem.

BACKGROUND

Referring to FIG. 1 of the drawings, the reference numeral 100 generally designates a conventional headphone subsystem. With the headphone subsystem 100, a headphone jack 110 is inserted into a receptacle 112 to allow external components (such as speakers) to interact with circuitry in a device (such as a portable media player). Typically, headphone jacks (such as jack 110) use four pins (labeled as 1, 2, 3, and 4) that allow a user to provide input (through a microphone, for example) and receive an output (through speakers, for example) with one receptacle and one jack. An example of this type of subsystem 100 is a hands-free microphone/speaker commonly used with mobile phones.

In operation, the subsystem 100 is able to discern which of the pins (1, 2, 3, or 4) of jack 110 is ground and is able to discern the direction of data. To accomplish this, subsystem 100 is generally comprised of amplifiers 102, 104, 106, and 108, controller 114, switch network 116, and capacitors C1 and C2. Amplifier 102 and 104 provide output voltages VL and VR to pins 1 and 2 of jack 110 through receptacle 112 so as to provide outputs for left and right speakers, for example. Amplifier 108 (which is coupled to pins 3 and 4 through capacitors C1 and C2) operates as a preamplifier for a microphone, for example. Amplifier 106 and resistor R1 provide a bias voltage to switch network 116. Generally, pins 3 and 4 can be either ground or an input (i.e., microphone input), which is a reason for the switch network 116. Controller 114 is able to detect which of the pins 3 or 4 from jack 110 is ground and is able to control switches S1, S2, S5 and S6 accordingly. For example, when pin 4 of jack 110 is detected as being ground, switch S6 is actuated to coupled pin 4 to ground, and switch S1 is actuated to couple pin 3 of jack 110 to resistor R1.

Turning to FIG. 2, a simplified configuration for amplifiers 102 and 104 can be seen. As can be seen, speakers 118 and 120 share ground with a microphone. In operation, speaker 118 is supposed to receive voltage VL, while speaker is supposed to receive voltage VR. However, if voltage VR is 0, then the voltage across speaker 120 is the voltage across switch S2 or S1, which is proportional to voltage VL because switch S2 or S1 is coupled in series with speaker 118. Thus, there is a voltage drop across speaker 120 that is proportional to voltage VL, which is cross-talk. The cross-talk depends on the ON-impedance of the switch S1 or S2. In particular, the cross-talk (CT) can be calculated as follows:

$$CT = 20\text{Log}\left(\frac{R_{SW}}{R_{SP}+2R_{SW}}\right) \quad (1)$$

where $R_{SW}$ is the impedance of switch S1 or S2 and $R_{SP}$ is the impedance of the speaker (i.e., speaker 114). For example, if $R_{SW}$ is $0.1\Omega$ and $R_{SP}$ is $16\Omega$, then there is cross-talk of 22 dB. Therefore, there is a need for circuitry that reduces cross-talk.

SUMMARY

A preferred embodiment of the present invention, accordingly, provides an apparatus. The apparatus comprises a first terminal; a second terminal; a third terminal; an amplifier having a negative input, a positive input, and an output, wherein the negative input of the amplifier receives at least a portion of an input signal, and wherein the output of the amplifier is coupled to the first terminal; a resistor that is coupled to the positive input of the amplifier; and a switch network that is coupled to the second terminal, the third terminal, ground, and the resistor, wherein the switch network couples the resistor and the second terminal to ground when the second terminal is detected as ground, and wherein the switch network couples the resistor and the third terminal to ground when the third terminal is detected as ground.

In accordance with a preferred embodiment of the present invention, the apparatus further comprises a controller that detects whether the second terminal or the third terminal is ground and that controls the switch network.

In accordance with a preferred embodiment of the present invention, the switch network further comprises: a first switch that is coupled between the second terminal and the resistor, wherein the first switch is actuated when the second terminal is detected as ground; a second switch that is coupled between the second terminal and ground, wherein the second switch is actuated when the second terminal is detected as ground; a third switch that is coupled between the third terminal and the resistor, wherein the third switch is actuated when the third terminal is detected as ground; and a fourth switch that is coupled between the third terminal and ground, wherein the fourth switch is actuated when the second terminal is detected as ground.

In accordance with a preferred embodiment of the present invention, the apparatus further comprises: a second resistor that is coupled to the negative input of the amplifier; a third resistor that is coupled between the negative input of the amplifier and the output of the amplifier; and a fourth resistor that is coupled to the positive input of the amplifier.

In accordance with a preferred embodiment of the present invention, the input signal is a differential signal, and wherein the second and fourth resistors receive the differential input signal.

In accordance with a preferred embodiment of the present invention, the amplifier further comprises a first amplifier, and wherein the fourth resistor is coupled to ground, and wherein the apparatus further comprises: a second amplifier having a negative input, a positive input, and an output, wherein the positive input of the second amplifier is coupled to ground, and wherein the output of the second amplifier is coupled to the second resistor; a fifth resistor that is coupled to the negative input of the second amplifier; and a sixth resistor that is coupled between the negative input of the second amplifier and the output of the second amplifier.

In accordance with a preferred embodiment of the present invention, an apparatus is provided. The apparatus comprises a receptacle that is adapted to receive a headphone jack with a first pin, a second pin, a third pin, and a fourth pin; a first amplifier having a negative input, a positive input, and an output, wherein the negative input of the first amplifier receives at least a portion of an input signal, and wherein the output of the first amplifier is coupled to the receptacle so as to provide a first voltage for the first pin; a second amplifier having a negative input, a positive input, and an output, wherein the negative input of the second amplifier receives at least a portion of the input signal, and wherein the output of the second amplifier is coupled to the receptacle so as to provide a second voltage for the second pin; a first resistor that is coupled to the positive input of the first amplifier; a second resistor that is coupled to the positive input of the second amplifier; and a switch network that is coupled to the receptacle, ground, the first resistor, and the second resistor, wherein the switch network couples the first resistor, the second resistor, and the third pin to ground when the third pin is detected as ground, and wherein the switch network couples the first resistor, the second resistor, and the fourth pin to ground when the fourth pin is detected as ground.

In accordance with a preferred embodiment of the present invention, the switch network further comprises: a first switch network that is coupled to the receptacle, ground, and the first resistor, wherein the first switch network couples the first resistor and the third pin to ground when the third pin is detected as ground, and wherein the first switch network couples the first resistor and the fourth pin to ground when the fourth pin is detected as ground; and a second switch network that is coupled to the receptacle, ground, and the second resistor, wherein the second switch network couples the second resistor and the third pin to ground when the third pin is detected as ground, and wherein the second switch network couples the second resistor and the fourth pin to ground when the fourth pin is detected as ground.

In accordance with a preferred embodiment of the present invention, each of the first and second switch networks further comprises: a first switch that is coupled between the second terminal and one of the first resistor and the second resistor, wherein the first switch is actuated when the second terminal is detected as ground; a second switch that is coupled between the second terminal and ground, wherein the second switch is actuated when the second terminal is detected as ground; a third switch that is coupled between the third terminal and one of the first resistor and the second resistor, wherein the third switch is actuated when the third terminal is detected as ground; and a fourth switch that is coupled between the third terminal and ground, wherein the fourth switch is actuated when the second terminal is detected as ground.

In accordance with a preferred embodiment of the present invention, the apparatus further comprises: a third resistor that is coupled to the negative input of the first amplifier; a fourth resistor that is coupled to the negative input of the second amplifier; a fifth resistor that is coupled between the negative input of the first amplifier and the output of the first amplifier; a sixth resistor that is coupled between the negative input of the second amplifier and the output of the second amplifier; a seventh resistor that is coupled to the positive input of the second amplifier; and an eighth resistor that is coupled to the positive input of the second amplifier.

In accordance with a preferred embodiment of the present invention, the input signal is a differential signal, and wherein the first, second, seventh, and eighth resistors receive the differential input signal.

In accordance with a preferred embodiment of the present invention, the seventh and eighth resistors are coupled to ground, and wherein the apparatus further comprises: a third amplifier having a negative input, a positive input, and an output, wherein the positive input of the third amplifier is coupled to ground, and wherein the output of the third amplifier is coupled to the third resistor; a fourth amplifier having a negative input, a positive input, and an output, wherein the positive input of the fourth amplifier is coupled to ground, and wherein the output of the fourth amplifier is coupled to the fourth resistor; a ninth resistor that is coupled to the negative input of the third amplifier; a tenth resistor that is coupled to the negative input of the fourth amplifier; an eleventh resistor that is coupled between the negative input of the third amplifier and the output of the third amplifier; and a twelfth resistor that is coupled between the negative input of the fourth amplifier and the output of the fourth amplifier.

In accordance with a preferred embodiment of the present invention, an apparatus is provided. The apparatus comprises a headphone jack having a first output pin, a second output pin, a first input pin, and a second input pin; a receptacle that is coupled to the headphone jack; a capacitor that receives at least a portion of an input signal; a first amplifier having a negative input, a positive input, and an output, wherein the output of the first amplifier is coupled to the receptacle so as to provide a first voltage for the first pin; a second amplifier having a negative input, a positive input, and an output, wherein the output of the second amplifier is coupled to the receptacle so as to provide a second voltage for the second pin; a first resistor that is coupled to the positive input of the first amplifier; a second resistor that is coupled to the positive input of the second amplifier; a third resistor that is coupled to the negative input of the first amplifier and to the capacitor; a fourth resistor that is coupled to the negative input of the second amplifier and to the capacitor; a fifth resistor that is coupled between the negative input of the first amplifier and the output of the first amplifier; a sixth resistor that is coupled between the negative input of the second amplifier and the output of the second amplifier; a seventh resistor that is coupled to the positive input of the second amplifier; an eighth resistor that is coupled to the positive input of the second amplifier; a switch network that is coupled to the receptacle, ground, the first resistor, and the second resistor, wherein the switch network couples the first resistor, the second resistor, and the third pin to ground when the third pin is detected as ground, and wherein the switch network couples the first resistor, the second resistor, and the fourth pin to ground when the fourth pin is detected as ground.

In accordance with a preferred embodiment of the present invention, the switch network further comprises: a first switch that is coupled between the second terminal and each of the first resistor and the second resistor, wherein the first switch is actuated when the second terminal is detected as ground; a second switch that is coupled between the second terminal and ground, wherein the second switch is actuated when the second terminal is detected as ground; a third switch that is coupled between the third terminal and each of the first resistor and the second resistor, wherein the third switch is actuated when the third terminal is detected as ground; and a fourth switch that is coupled between the third terminal and ground, wherein the fourth switch is actuated when the second terminal is detected as ground.

In accordance with a preferred embodiment of the present invention, the capacitor further comprises: a first capacitor that is coupled to the third resistor; and a second capacitor that is coupled to the fourth resistor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
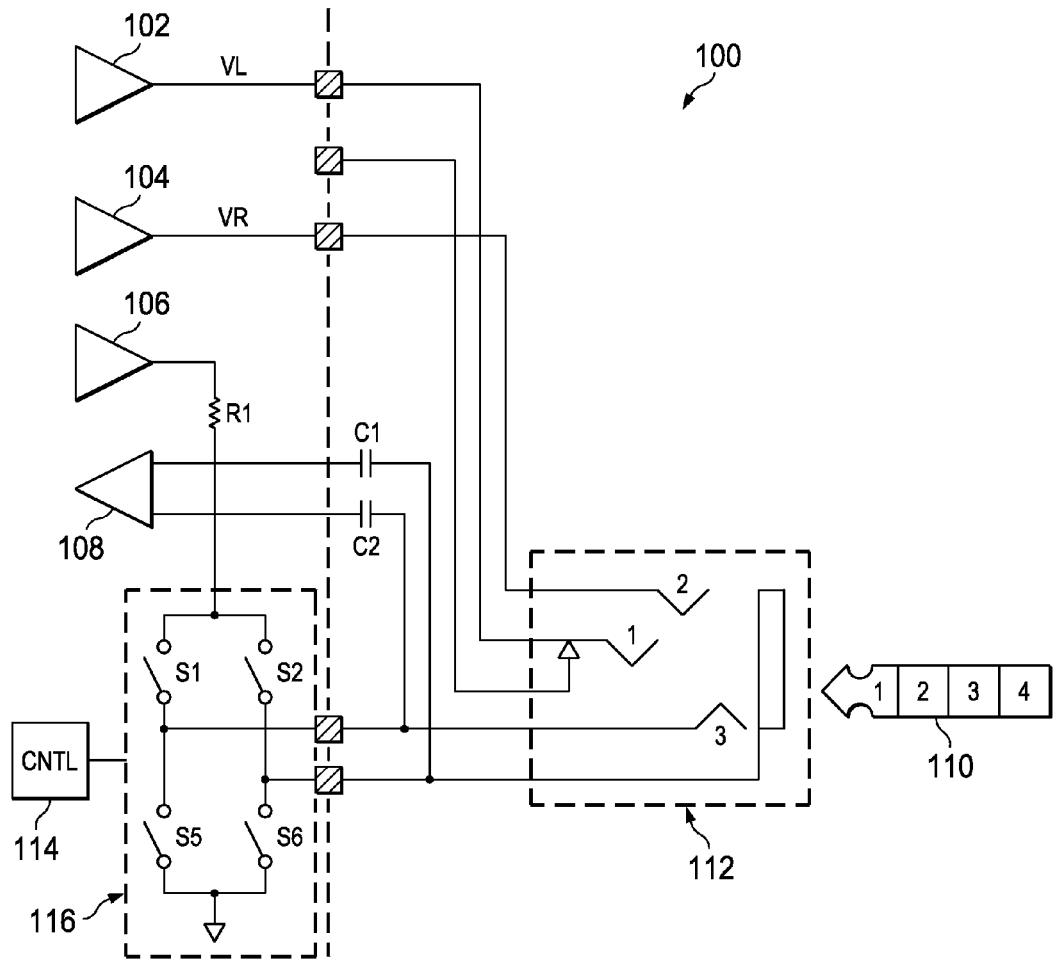
FIGS. 1 and 2 are diagrams depicting an example of a conventional headphone subsystem.
Figure 2:
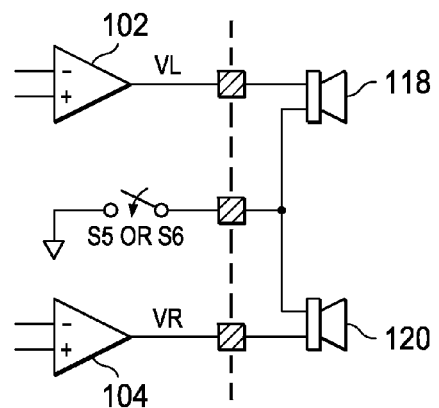

Refer now to the drawings wherein depicted elements are, for the sake of clarity, not necessarily shown to scale and wherein like or similar elements are designated by the same reference numeral through the several views.

Figure 3:
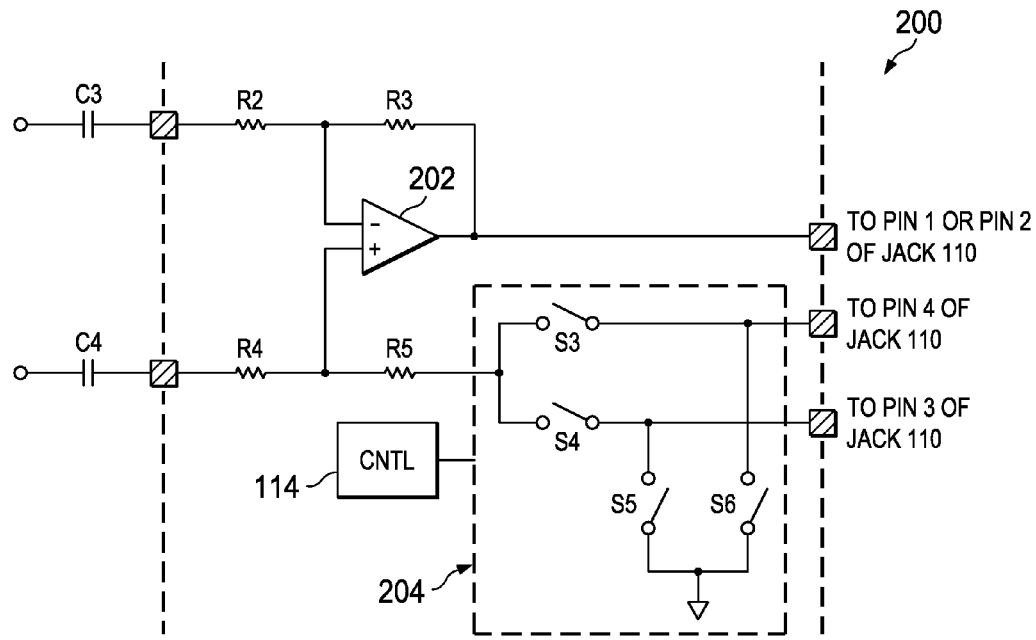
FIG. 3 is diagram depicting an example of a portion of a headphone subsystem in accordance with a preferred embodiment of the present invention having differential inputs.

Turning to FIG. 3, a headphone subsystem 200 (having differential inputs) in accordance with a preferred embodiment of the present invention can be seen. When comparing subsystem 100 with subsystem 200, amplifier 202 can replace amplifiers 102 and 104. The switch network 204 generally comprises switches S3, S4, S5, and S6 (where switches S5 and S6 are common to both networks 116 and 204). In operation (similar to the operation of subsystem 100), controller 114 detects whether pin 3 or pin 4 of jack 110 is ground and actuates switches S3, S4, S5, and S6 accordingly. For example, when pin 4 of jack 110 is detected as ground, then controller actuates switches S3 and S6 so as to couple pin 4 to ground. It should be noted as well that a switch network 204 is generally used for each amplifier 202 that replaces amplifiers 102 and 104; however, it is possible for the switch networks 204 for each amplifier 202 that replaces amplifier 102 and 104 to share switches S5 and S6 to reduce the area used.

Additionally, a resistor network is provided to generate the proper feedback for amplifier 202. Resistors R2 and R4 (which generally have about the same resistance) are coupled to AC coupling capacitors C3 and C4 (which each receive a portion of a differential input signal). The negative input of amplifier 202 is coupled resistor R2, while resistor R3 is coupled between the output of amplifier 202 and the negative input of amplifier 202 to operate as a feedback resistor. The positive input of amplifier 202 is coupled to resistor R4, while resistor R5 is coupled between the switch network 204 and the positive input of amplifier 202. Additionally, resistors R3 and R5 generally have about the same resistance. As a result of this configuration, resistor R5 provides feedback to the positive input of amplifier 202 from the "ground switch" (switches S3 and S6 when pin 4 of jack 110 is ground or switches S4 and S5 when pin 3 of jack 110 is ground), which generally cancel noise (AC and DC) from the "ground switch" and which generally reduces cross-talk.

Figure 4:
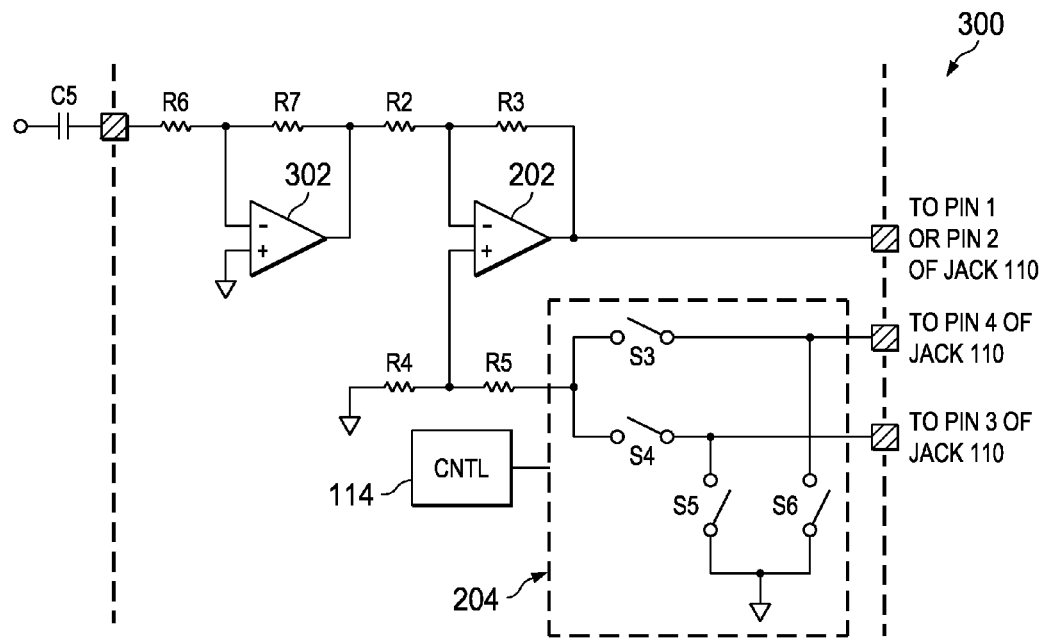
FIG. 4 is diagram depicting an example of a portion of a headphone subsystem in accordance with a preferred embodiment of the present invention having a single-ended input.

Now turning to FIG. 4, a headphone subsystem 300 (having a single-ended input) in accordance with a preferred embodiment of the present invention can be seen. With subsystem 300, capacitors C3 and C4 are replaced with capacitor C5 for each amplifier 202 and resistor R4 is coupled to ground. Additionally, an amplifier or preamplifier 302 and resistors R6 and R7 are provided. In particular, resistor R6 is generally coupled to capacitor C5 and the negative input of amplifier 302, and resistor R6 is generally coupled between the negative input of amplifier 302 and the output of amplifier 302 (which is also coupled to resistor R2). Generally, resistors R6 and R7 have about the same resistance. The positive input of amplifier 302 is also coupled to ground.

Therefore, by using subsystem 200 for differential input signals or subsystem 300 for single-ended input signals, the performance can be improved by allowing for a simple solution that will work for a wide range of "ground switch" impedances. Specifically, these configurations have a theoretically infinite rejection of ground noise, and the cross-talk for these configurations are not generally dependent on the "ground switch" or speaker impedance, which is highly desirable.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a first terminal;
    a second terminal;
    a third terminal;
    an amplifier having a negative input, a positive input, and an output, wherein the negative input of the amplifier receives at least a portion of an input signal, and wherein the output of the amplifier is coupled to the first terminal;
    a resistor that is coupled to the positive input of the amplifier; and
    a switch network that is coupled to the second terminal, the third terminal, ground, and the resistor, wherein the switch network couples the resistor and the second terminal to ground when the second terminal is detected as ground, and wherein the switch network couples the resistor and the third terminal to ground when the third terminal is detected as ground.

2. The apparatus of claim 1, wherein the apparatus further comprises a controller that detects whether the second terminal or the third terminal is ground and that controls the switch network.

3. The apparatus of claim 1, wherein the switch network further comprises:
    a first switch that is coupled between the second terminal and the resistor, wherein the first switch is actuated when the second terminal is detected as ground;
    a second switch that is coupled between the second terminal and ground, wherein the second switch is actuated when the second terminal is detected as ground;
    a third switch that is coupled between the third terminal and the resistor, wherein the third switch is actuated when the third terminal is detected as ground; and a fourth switch that is coupled between the third terminal and ground, wherein the fourth switch is actuated when the second terminal is detected as ground.

4. The apparatus of claim 3, wherein the apparatus further comprises:
a second resistor that is coupled to the negative input of the amplifier;
a third resistor that is coupled between the negative input of the amplifier and the output of the amplifier; and
a fourth resistor that is coupled to the positive input of the amplifier.

5. The apparatus of claim 4, wherein the input signal is a differential signal, and wherein the second and fourth resistors receive the differential input signal.

6. The apparatus of claim 4, wherein the amplifier further comprises a first amplifier, and wherein the fourth resistor is coupled to ground, and wherein the apparatus further comprises:
a second amplifier having a negative input, a positive input, and an output, wherein the positive input of the second amplifier is coupled to ground, and wherein the output of the second amplifier is coupled to the second resistor;
a fifth resistor that is coupled to the negative input of the second amplifier; and
a sixth resistor that is coupled between the negative input of the second amplifier and the output of the second amplifier.

7. An apparatus comprising:
a receptacle that is adapted to receive a headphone jack with a first pin, a second pin, a third pin, and a fourth pin;
a first amplifier having a negative input, a positive input, and an output, wherein the negative input of the first amplifier receives at least a portion of an input signal, and wherein the output of the first amplifier is coupled to the receptacle so as to provide a first voltage for the first pin;
a second amplifier having a negative input, a positive input, and an output, wherein the negative input of the second amplifier receives at least a portion of the input signal, and wherein the output of the second amplifier is coupled to the receptacle so as to provide a second voltage for the second pin;
a first resistor that is coupled to the positive input of the first amplifier;
a second resistor that is coupled to the positive input of the second amplifier; and
a switch network that is coupled to the receptacle, ground, the first resistor, and the second resistor, wherein the switch network couples the first resistor, the second resistor, and the third pin to ground when the third pin is detected as ground, and wherein the switch network couples the first resistor, the second resistor, and the fourth pin to ground when the fourth pin is detected as ground.

8. The apparatus of claim 7, wherein the switch network further comprises:
a first switch network that is coupled to the receptacle, ground, and the first resistor, wherein the first switch network couples the first resistor and the third pin to ground when the third pin is detected as ground, and wherein the first switch network couples the first resistor and the fourth pin to ground when the fourth pin is detected as ground; and
a second switch network that is coupled to the receptacle, ground, and the second resistor, wherein the second switch network couples the second resistor and the third pin to ground when the third pin is detected as ground, and wherein the second switch network couples the second resistor and the fourth pin to ground when the fourth pin is detected as ground.

9. The apparatus of claim 8, wherein each of the first and second switch networks further comprises:
a first switch that is coupled between the second terminal and one of the first resistor and the second resistor, wherein the first switch is actuated when the second terminal is detected as ground;
a second switch that is coupled between the second terminal and ground, wherein the second switch is actuated when the second terminal is detected as ground;
a third switch that is coupled between the third terminal and one of the first resistor and the second resistor, wherein the third switch is actuated when the third terminal is detected as ground; and
a fourth switch that is coupled between the third terminal and ground, wherein the fourth switch is actuated when the second terminal is detected as ground.

10. The apparatus of claim 7, wherein the apparatus further comprises a controller that detects whether the third pin or the fourth pin is ground and that controls the first and second switch networks.

11. The apparatus of claim 7, wherein the switch network further comprises:
a first switch that is coupled between the second terminal and each of the first resistor and the second resistor, wherein the first switch is actuated when the second terminal is detected as ground;
a second switch that is coupled between the second terminal and ground, wherein the second switch is actuated when the second terminal is detected as ground;
a third switch that is coupled between the third terminal and each of the first resistor and the second resistor, wherein the third switch is actuated when the third terminal is detected as ground; and
a fourth switch that is coupled between the third terminal and ground, wherein the fourth switch is actuated when the second terminal is detected as ground.

12. The apparatus of claim 11, wherein the apparatus further comprises:
a third resistor that is coupled to the negative input of the first amplifier;
a fourth resistor that is coupled to the negative input of the second amplifier;
a fifth resistor that is coupled between the negative input of the first amplifier and the output of the first amplifier;
a sixth resistor that is coupled between the negative input of the second amplifier and the output of the second amplifier;
a seventh resistor that is coupled to the positive input of the second amplifier; and
an eighth resistor that is coupled to the positive input of the second amplifier.

13. The apparatus of claim 12, wherein the input signal is a differential signal, and wherein the first, second, seventh, and eighth resistors receive the differential input signal.

14. The apparatus of claim 13, wherein the seventh and eighth resistors are coupled to ground, and wherein the apparatus further comprises:
a third amplifier having a negative input, a positive input, and an output, wherein the positive input of the third amplifier is coupled to ground, and wherein the output of the third amplifier is coupled to the third resistor;
a fourth amplifier having a negative input, a positive input, and an output, wherein the positive input of the fourth amplifier is coupled to ground, and wherein the output of the fourth amplifier is coupled to the fourth resistor;

a ninth resistor that is coupled to the negative input of the third amplifier;

a tenth resistor that is coupled to the negative input of the fourth amplifier;

an eleventh resistor that is coupled between the negative input of the third amplifier and the output of the third amplifier; and a twelfth resistor that is coupled between the negative input of the fourth amplifier and the output of the fourth amplifier.

15. An apparatus comprising:

a headphone jack having a first output pin, a second output pin, a first input pin, and a second input pin;

a receptacle that is coupled to the headphone jack;

a capacitor that receives at least a portion of an input signal;

a first amplifier having a negative input, a positive input, and an output, wherein the output of the first amplifier is coupled to the receptacle so as to provide a first voltage for the first pin;

a second amplifier having a negative input, a positive input, and an output, wherein the output of the second amplifier is coupled to the receptacle so as to provide a second voltage for the second pin;

a first resistor that is coupled to the positive input of the first amplifier;

a second resistor that is coupled to the positive input of the second amplifier;

a third resistor that is coupled to the negative input of the first amplifier and to the capacitor;

a fourth resistor that is coupled to the negative input of the second amplifier and to the capacitor;

a fifth resistor that is coupled between the negative input of the first amplifier and the output of the first amplifier;

a sixth resistor that is coupled between the negative input of the second amplifier and the output of the second amplifier;

a seventh resistor that is coupled to the positive input of the second amplifier;

an eighth resistor that is coupled to the positive input of the second amplifier;

a switch network that is coupled to the receptacle, ground, the first resistor, and the second resistor, wherein the switch network couples the first resistor, the second resistor, and the third pin to ground when the third pin is detected as ground, and wherein the switch network couples the first resistor, the second resistor, and the fourth pin to ground when the fourth pin is detected as ground.

16. The apparatus of claim 15, wherein the switch network further comprises:

a first switch network that is coupled to the receptacle, ground, and the first resistor, wherein the first switch network couples the first resistor and the third pin to ground when the third pin is detected as ground, and wherein the first switch network couples the first resistor and the fourth pin to ground when the fourth pin is detected as ground; and a second switch network that is coupled to the receptacle, ground, and the second resistor, wherein the second switch network couples the second resistor and the third pin to ground when the third pin is detected as ground, and wherein the second switch network couples the second resistor and the fourth pin to ground when the fourth pin is detected as ground.

17. The apparatus of claim 16, wherein each of the first and second switch networks further comprises:

a first switch that is coupled between the second terminal and one of the first resistor and the second resistor, wherein the first switch is actuated when the second terminal is detected as ground;

a second switch that is coupled between the second terminal and ground, wherein the second switch is actuated when the second terminal is detected as ground;

a third switch that is coupled between the third terminal and one of the first resistor and the second resistor, wherein the third switch is actuated when the third terminal is detected as ground; and a fourth switch that is coupled between the third terminal and ground, wherein the fourth switch is actuated when the second terminal is detected as ground.

18. The apparatus of claim 15, wherein the apparatus further comprises a controller that detects whether the third pin or the fourth pin is ground and that controls the first and second switch networks.

19. The apparatus of claim 15, wherein the switch network further comprises:

a first switch that is coupled between the second terminal and each of the first resistor and the second resistor, wherein the first switch is actuated when the second terminal is detected as ground;

a second switch that is coupled between the second terminal and ground, wherein the second switch is actuated when the second terminal is detected as ground;

a third switch that is coupled between the third terminal and each of the first resistor and the second resistor, wherein the third switch is actuated when the third terminal is detected as ground; and a fourth switch that is coupled between the third terminal and ground, wherein the fourth switch is actuated when the second terminal is detected as ground.

20. The apparatus of claim 15, wherein the capacitor further comprises:

a first capacitor that is coupled to the third resistor; and a second capacitor that is coupled to the fourth resistor.

* * * * *